US012638533B2

(12) United States Patent
Coelho et al.

(10) Patent No.: US 12,638,533 B2
(45) Date of Patent: May 26, 2026

(54) SYSTEM, METHOD AND COMPUTER-ACCESSIBLE MEDIUM FOR DIFFUSION MRI WITHOUT SHELLS

(71) Applicant: NEW YORK UNIVERSITY, New York, NY (US)

(72) Inventors: Santiago Coelho, New York, NY (US); Els Fieremans, New York, NY (US); Dmitry S. Novikov, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 0 days.

(21) Appl. No.: 19/095,419

(22) Filed: Mar. 31, 2025

(65) Prior Publication Data

US 2025/0224474 A1 Jul. 10, 2025

Related U.S. Application Data

(63) Continuation of application No. PCT/US2023/034248, filed on Sep. 30, 2023.

(Continued)

(51) Int. Cl.

*G01V 3/00* (2006.01)
*G01R 33/563* (2006.01)
*G06T 7/00* (2017.01)

(52) U.S. Cl.

CPC ...... *G01R 33/56341* (2013.01); *G06T 7/0012* (2013.01); *G06T 2207/30024* (2013.01)

(58) Field of Classification Search

CPC .............. G01R 33/287; G01R 33/4835; G01R 33/5608; A61B 2090/374

(Continued)

(56) References Cited

U.S. PATENT DOCUMENTS 7,069,068 B1 * 6/2006 Ostergaard ............. A61B 5/055 600/407
2007/0249931 A1 10/2007 Fain et al.

(Continued)

FOREIGN PATENT DOCUMENTS

CN 108351395 A * 7/2018 ......... G01R 33/5608
WO WO-2007147685 A1 * 12/2007 ............. G01R 33/46

(Continued)

OTHER PUBLICATIONS

International Search Report and Written Opinion dated Feb. 4, 2024 received in PCT/US2023/034248, 45 pages.

(Continued)

*Primary Examiner* — Walter L Lindsay, Jr.
*Assistant Examiner* — Frederick Wenderoth
(74) *Attorney, Agent, or Firm* — HUNTON ANDREWS KURTH LLP

(57) ABSTRACT

Exemplary system, method and computer arrangement for determining rotational invariants, fiber orientations, and scalar parameters of fiber tracts (e.g., compartment fractions, which can relate to intra/extra-cellular space volumes; compartment diffusivities; relaxation rates; exchange rates between compartments; characteristics of structural disorder such as axonal beading) from a general diffusion MRI acquisition is described. For example, gradient directions may not necessarily be arranged in so-called shells, and an acquisition may vary spatially. Furthermore, each acquisition can be undersampled in the k-space. A procedure can also be included for receiving information related to the at least one image. Another procedure can be provided for decoupling tissue and protocol parameters based on a singular value decomposition. A further procedure can be provided for grouping singular vectors into multiplets based on symmetries. Still further procedures can be provided for (Continued)

forming rotational invariants and/or for a parameter estimation.

16 Claims, 10 Drawing Sheets

Related U.S. Application Data

(60) Provisional application No. 63/412,181, filed on Sep. 30, 2022.

(58) Field of Classification Search
USPC .......................................................... 324/309
See application file for complete search history.

(56) References Cited

U.S. PATENT DOCUMENTS

| | | | | |
|---|---|---|---|---|
| 2011/0199084 | A1 | 8/2011 | Hasan | |
| 2012/0280686 | A1 | 11/2012 | White et al. | |
| 2016/0231410 | A1 | 8/2016 | Warfield et al. | |
| 2016/0343129 | A1* | 11/2016 | Novikov | G01R 33/5608 |
| 2017/0146628 | A1 | 5/2017 | Song et al. | |
| 2020/0221991 | A9 | 7/2020 | Wang et al. | |

FOREIGN PATENT DOCUMENTS

| | | | | |
|---|---|---|---|---|
| WO | WO-2016127144 | A1 * | 8/2016 | G01R 33/448 |
| WO | WO-2017182616 | A1 * | 10/2017 | G01R 33/56341 |

OTHER PUBLICATIONS

Jallais et al., “Inverting brain grey matter models with likelihood-free inference: a tool for trustable cytoarchitecture measurements” Journal of Machine Learning for Biomedical Imaging. 2022:010. pp 1-27; arXiv:2111.08693v2 [q-bio. QM] May 4, 2022: retrieved on [Dec. 18, 2023] retrieved from the Internet, <URL:https://arxiv.org/pdf/2111.08693.pdf>, 28 pages.

* cited by examiner

Acquire dMRI not necessarily arranged into shells, but with directions covering a sphere
<u>105</u>

Segment tissue by type
(same kernel functional form)
<u>110</u>

Perform SVD on a subset of voxels
within a tissue type
<u>115</u>

Group singular vectors into multiplets
based on their symmetries (e.g., characterized
by numbers l, m ,n); optionally, rotate within
each multiplet to the standard spherical
harmonics basis
<u>120</u>

Compute $m$-independent $\alpha_{ln}$ and $r_{ln}$, and
their signs
<u>125</u>

Compute rotational invariants
<u>130</u>

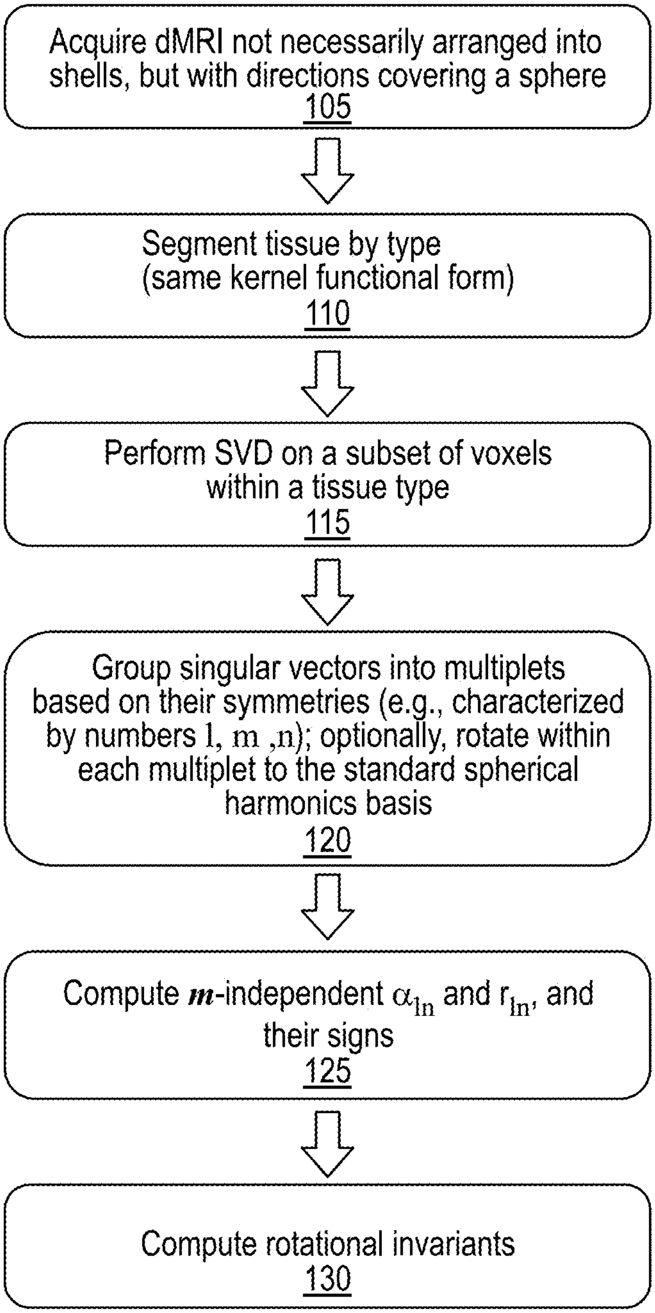

FIG. 1

SYSTEM, METHOD AND COMPUTER-ACCESSIBLE MEDIUM FOR DIFFUSION MRI WITHOUT SHELLS

CROSS REFERENCE TO RELATED APPLICATION(S)

This application relates to and claims priority from International Application no. PCT/US2023/034248 filed on Sep. 30, 2023 and relates to and claims priority from U.S. Patent Application No. 63/412,181, filed on Sep. 30, 2022, the entire disclosures of which are incorporated herein by reference.

STATEMENT REGARDING FEDERALLY SPONSORED RESEARCH

This invention was made with government support under Grant Nos. P41 EB017183, RO1 NS088040, and RO1 EB027075, awarded by the National Institutes of Health. The government has certain rights in the invention.

FIELD OF THE DISCLOSURE

The present disclosure relates generally to an exemplary system, method and computer-accessible medium for diffusion MRI (dMRI), which can be a non-invasive diagnostic imaging modality as, for example, applied to any fibrous tissue, such as neuronal tissue (brain or spinal cord) as well as other fibrous tissue such as muscle or prostate or kidneys.

BACKGROUND INFORMATION

In some diffusion MRI (dMRI) applications, one may be interested in the microstructure parameters of fiber fascicles (such as, but not limited to, compartment fractions, which can relate to intra/extra-cellular space volumes; compartment diffusivities; relaxation rates; exchange rates between compartments; characteristics of structural disorder such as axonal beading, see, e.g., References 1-8). These diagnostically vital tissue microstructure metrics can be revealed by, e.g., sampling as many as possible scan parameters: diffusion weightings, diffusion tensor (B-tensor) shapes, diffusion times, inversion and echo times.

Yet most of scan time may be spent on oversampling the diffusion directions for each combination of scan parameters, because fiber fascicles can be orientationally dispersed in any imaging voxel, and factoring out their complex orientational distribution nominally may require performing a so-called "shelled" acquisition, i.e., for any set of scan parameters, one acquires a number of diffusion directions uniformly distributed on a surface of a sphere (a shell) in the diffusion q-space. Completing every such spherical shell takes time, e.g., 20-60 directions for a reasonable sphere coverage, for each scan parameter combination. Hence, just because of the fiber orientation dispersion, one may have to spend that much more time to essentially oversample the directions, and that less time is left to sample the most relevant scan parameters for microstructure mapping. This disproportionate oversampling of directions to, for example, construct rotational invariants (and to thereby factor out the fiber ODF) (see, e.g., References 8-11), and, for example, to estimate model parameters, may be a giant scan-time sink; the associated mis-allocation of scan time has been an unresolved problem so far.

This mis-allocation of scan time (oversampling of directions in the diffusion q-space) calls for designing well-grounded undersamplings of the directions in the diffusion q-space. Furthermore, such highly desired q-space undersamplings could be beneficially combined with the k-space undersamplings in each measurement, for example, to reduce scan time and/or increase the signal-to-noise ratio; such k-space undersamplings can differ between measurements.

Thus, it may be beneficial to provide an exemplary system, method, and computer-accessible medium for diffusion MRI (dMRI) which can overcome at least some of the deficiencies described herein above.

SUMMARY OF EXEMPLARY EMBODIMENTS

The following is intended to be a brief summary of the exemplary embodiments of the present disclosure, and is not intended to limit the scope of the exemplary embodiments.

Exemplary system, method and computer-accessible medium, according to exemplary embodiments of the present disclosure, relate multiple inequivalent combinations of scan parameters can be measured, while, e.g., spending very few gradient directions (even only a single gradient direction) per any scan parameter combination. In other words, exemplary system, method and computer-accessible medium, according to exemplary embodiments of the present disclosure, can solve, among others, the oversampling problem. Embodiments of the present disclosure can enable one to sample what is most relevant as much as possible, provided that a sufficient set of diffusion directions is assigned to the scan parameter combinations.

For example, if one has time to sample 100 scan parameters (i.e., perform 100 diffusion measurements), following the teachings of the exemplary embodiments of the present disclosure, one can choose 100 different directions on a sphere and assign each distinct direction to each measurement, such that no shells are used whatsoever. Even with such a seemingly non-rotationally-invariant acquisition, the exemplary system, method and computer-accessible medium can enable the recovery of signals' rotational invariants and fiber orientations, which then can enable estimation of microstructure parameters for fiber fascicles. Also, each of such measurements may be further undersampled in the k-space, for example, to reduce scan time and/or increase the signal-to-noise ratio (SNR).

An exemplary useful by-product of the exemplary system, method and computer-accessible medium, according to exemplary embodiments of the present disclosure, an exemplary procedure can be provided for fast parameter estimation of microstructure metrics when each imaging voxel has its own unique set of diffusion directions and other scan parameters, e.g., due to gradient nonlinearities in high-performance scanners.

The exemplary system, method and computer-accessible medium, according to exemplary embodiments of the present disclosure, can radically increase the information content of diffusion-based MRI acquisitions, as well as optimize the acquisition protocols for best accuracy and precision of tissue microstructure metrics.

Exemplary system, method and computer-accessible medium, according to exemplary embodiments of the present disclosure, can include a procedure for determining rotational invariants, fiber orientation distribution function (ODF), and scalar parameters of fiber tracts (such as, but not limited to, compartment fractions, which can relate to intra/extra-cellular space volumes; compartment diffusivities; relaxation rates; exchange rates between compartments; characteristics of structural disorder) from diffusion MRI acquisitions in which gradient directions may not be arranged in so-called shells in the diffusion q-space. This can be in contrast to conventional MRI acquisitions which typically may require shells. The procedure can be based on or include a procedure for receiving information related to the at least one image; a procedure for decoupling tissue and protocol parameters based on a singular value decomposition of the MRI signal; a procedure for grouping singular vectors into multiplets based on symmetries; in case of k-space undersampling, a procedure for filling in the under-sampled k-space points; a procedure for forming rotational invariants; and a procedure for parameter estimation.

A variant of this procedure can enable fast parameter estimation of microstructure metrics when each imaging voxel has its own unique set of diffusion directions and other scan parameters, e.g., due to gradient nonlinearities in high-performance scanners.

In some exemplary aspects, the exemplary techniques according to systems, methods, and non-transitory computer-accessible medium according to the present disclosure relate to determining a plurality of tissue parameters of at least one tissue, comprising receiving information related to at least one diffusion magnetic resonance (dMR) image of the at least one tissue, selecting a subset of imaging voxels that contains at least one voxel in at least one image, generating protocol-specific and tissue-specific components of a signal in the selected subset of imaging voxels, and generating the at least one rotational invariant of the signal based on the at least one tissue-specific component of the signal in the at least one voxel of the selected subset of imaging voxels.

In some exemplary aspects, the exemplary techniques according to exemplary embodiments of the present disclosure relate to non-transitory computer-accessible medium wherein the received information is obtained by varying at least a dMR scan parameter.

In some exemplary aspects, the exemplary techniques according to exemplary embodiments of the present disclosure relate to non-transitory computer-accessible medium wherein the at least one dMR scan parameter is at least one of a diffusion direction, diffusion weighting, diffusion tensor, diffusion gradient wave form, diffusion tensor direction, diffusion time, echo time, or inversion time. The subset of imaging voxels can contain voxels for a particular tissue type. The particular tissue type can include a white matter, a gray matter, a muscle tissue, a prostate tissue and/or a kidney tissue. The protocol-specific and tissue-specific components of the signal can be generated by performing a singular value decomposition. The singular value decomposition can be truncated at particular number of components, ensuring a sufficient precision as determined by the signal-to-noise ratio. At least one of the components can be grouped into multiplets according to symmetries.

In some exemplary aspects, the exemplary techniques according to exemplary embodiments of the present disclosure relate to non-transitory computer-accessible medium whereas the components can be assigned at least one of the indices $\ell$, m, n based on symmetry considerations, wherein index $\ell$ corresponds to the degree and m is the order of a spherical harmonic, components with the same index $\ell$ and different m form a multiplet of degree $\ell$ when their singular values are similar or approximately degenerate, and index n is assigned to a multiplet of degree $\ell$ based on its singular value, with the singular values for multiplets sorted in the decreasing order.

In some exemplary aspects, the rotational invariant(s) of the tissue can be generated based on the at least one component by estimating the $L_2$ norm across the index m for given $\ell$ and n, and assigning signs to such norms. For example, a fiber orientation distribution can be generated based on the estimated tissue components grouped into multiplets. Tissue parameters can be estimated from rotational invariants based on the particular model of fiber response kernel.

In some exemplary aspects, the exemplary techniques according to systems, methods, and non-transitory computer-accessible medium according to the present disclosure relate to determining a plurality of tissue parameters of at least one tissue, in which, e.g., information related to at least one diffusion magnetic resonance (dMR) image of the at least one tissue can be received, a library of signals corresponding to a given biophysical tissue model can be generated, and the library can be decomposed into protocol-specific and tissue-specific components of a respective signal, a subset of imaging voxels that contains at least one voxel in at least one image can be selected, tissue-specific components of the signal in the selected subset of voxels can be generated based on interpolating the protocol-specific components of the signal in the library, and the model parameters and/or the fiber orientation parameters can be generated based on the generated tissue-specific components of the signal in the selected subset of voxels.

In some exemplary aspects, the received information can be obtained by varying at least one of the dMR scan parameters. In addition or alternatively, the dMR scan parameters can include at least one of diffusion direction, diffusion weighting, diffusion tensor, diffusion gradient waveform, diffusion tensor direction, diffusion time, echo time, and/or inversion time. A subset of imaging voxels can contains voxels for a particular tissue type. The particular tissue type can includes a white matter, a gray matter, a muscle tissue, a prostate tissue, and/or a kidney issue. Alternatively or in addition, the protocol-specific and tissue-specific components of the library of signals can be generated by performing a singular value decomposition. The singular value decomposition can be truncated at particular number of components ensuring sufficient precision, as determined by the signal-to-noise ratio.

In some exemplary aspects, one or more the library components can be grouped into multiplets according to symmetries. The components can be assigned one or more of the indices $\ell$, m, n based on symmetry considerations, whereas index $\ell$ corresponds to the degree and m is the order of a spherical harmonic, components with the same index $\ell$ and different m form a multiplet of degree $\ell$ when their singular values are similar or approximately degenerate, and index n is assigned to a multiplet of degree $\ell$ based on its singular value, with the singular values for multiplets sorted in the decreasing order. Additionally or alternatively, the library can be generated in a set of specifically designed interpolation points, such as, e.g., Chebyshev points, in the domain of the at least one of the scan parameters.

In some exemplary aspects, the protocol-specific components for a given subset of voxels cab be generated by an interpolation of the protocol-specific components of the library. Tissue-specific components for a given subset of voxels can be generated based on the decomposition of the signal into tissue-specific and protocol-specific components, and the interpolated protocol-specific components of the library. One or more of model parameters and fiber orientation parameters can be generated based on the tissue-specific components of the signal and the biophysical model employed for constructing the library.

In some exemplary aspects, the exemplary techniques according to systems, methods, and non-transitory computer-accessible medium according to the present disclosure relate to determining a plurality of tissue parameters of at least one tissue, in which, e.g., information related to at least one diffusion magnetic resonance (dMR) image of the at least one tissue can be received, protocol-specific and tissue-specific components of an undersampled signal can be generated in the k-space, and at least one rotational invariant of the signal can be generated based on the at least one tissue-specific component of the signal in the at least one voxel after filling in missing k-space points/information based on the subset of jointly undersampled measurements.

In some exemplary aspects, the received information can be obtained by varying at least a dMR scan parameter. Such least one dMR scan parameter(s) can be a diffusion direction, diffusion weighting, diffusion tensor, diffusion gradient wave form, diffusion tensor direction, diffusion time, echo time, and/or inversion time. The protocol-specific and tissue-specific components of the signal can be generated by performing a singular value decomposition. The singular value decomposition can be truncated at particular number of components, ensuring sufficient precision as determined by the signal-to-noise ratio.

In some exemplary aspects, at least one of the components can be grouped into multiplets according to symmetries, where components may be undersampled in the k-space. The components can be assigned at least one of the indices $\ell$, m, based on symmetry considerations, wherein index $\ell$ corresponds to the degree and m is the order of a spherical harmonic, components with the same index $\ell$ and different m can form a multiplet of degree $\ell$ when their singular values are similar or approximately degenerate, and index n can be assigned to a multiplet of degree $\ell$ based on its singular value, with the singular values for multiplets sorted in the decreasing order. The undersampled k-space components within a multiplet can be combined to yield at least one of a fully- or over-sampled k-space component, based on the protocol-dependent weights. The protocol-dependent weights can be generated based on similarity of the k-space components within the subset of the k-space. The map of at least one rotational invariant of the tissue can be generated based on the at least one component by Fourier transforming to real space, and estimating the $L_2$ norm across the index m for given $\ell$ and n.

In some exemplary aspects, a fiber orientation distribution can be generated based on the estimated tissue components Fourier transformed to real space. The undersampled components can be used to restore the fully- or over-sampled components using an iterative procedure. The missing k-space information can be restored based on (i) the kernel in the joint (q, k) space and/or (ii) the kernel learned for each multiplet separately. The kernel learned for at least one multiplet can be applied to the at least one of the remaining multiplets. Tissue parameters can be estimated from rotational invariants based on a model for the fiber response kernel.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 1 is a flow diagram for an exemplary sequence of steps for determining rotational invariants from non-shelled acquisitions according to an exemplary embodiment of the present disclosure;

Figure 2:
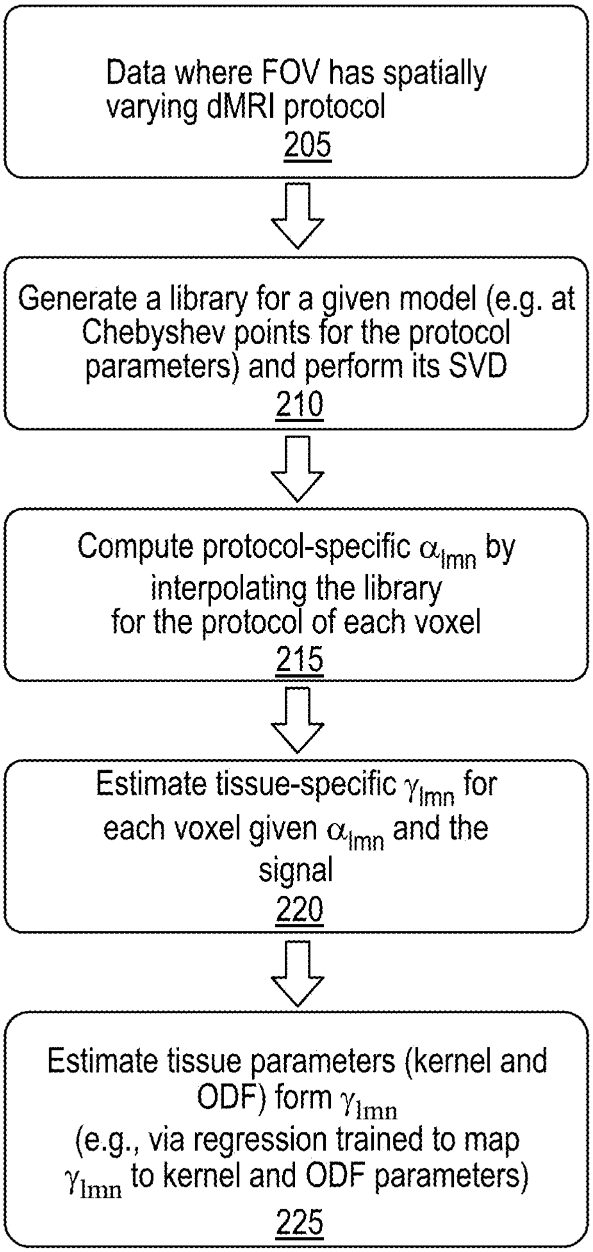
FIG. 2 is a flow diagram for an exemplary sequence of steps for parameter estimation for spatially varying MRI acquisitions according to an exemplary embodiment of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

Exemplary Rotational Invariants from Non-Shelled Acquisitions

In the brain, for example, the diffusion MRI signal in any tissue, such as, but not limited to, white matter or gray matter, in the direction g can be modeled as a convolution over the sphere $S^2$ (References 1-8, 12, 13):

$$S(b,\Delta,\hat{g}\mid\theta,p_{\ell m})=\int_{s^2}d\hat{n}\mathcal{K}(b,\Delta,\ldots,\hat{g}\cdot\hat{n}\mid\theta)\mathcal{P}(\hat{n}\mid p_{\ell m})=\sum\nolimits_{n'}U_{n'}(b,\Delta,\ldots,\hat{g})S_{n'}V_{n'}(\theta,p_{\ell m}),\tag{1}$$

where $\mathcal{K}$ is the response function (kernel) of the fiber fascicles located in a voxel (as a function of scan parameters such as, but not limited to, the diffusion b-value, B-tensor shape, the diffusion time Δ, echo time, inversion time, and so on; here, as an example, it is shown as function of b and Δ, with . . . standing for any other scan parameters), and $\mathcal{P}$ is the fiber fascicles' ODF, henceforth parametrized by its spherical harmonics coefficients $p_{\ell m}$. The kernel $\mathcal{K}$ depends on microstructure parameters, here denoted as θ, which can be, for example axonal (or, more generally, neurite) water fraction, intra- and extra-axonal diffusivities, exchange rate between intra- and extra-neurite compartments in a fascicle, the relaxation times in the intra- and extra-neurite space, and so on.

Without making any assumptions about the functional form of the kernel $\mathcal{K}$, other than axial symmetry, the signal admits the following representation in the spherical harmonics basis $Y_{\ell m}$, in terms of the rotational invariants $K_\ell$ the kernel:

$$S(b,\Delta,\hat{g}\mid x,p_{\ell m})=\sum\nolimits_{\ell m}S_{\ell m}(b,\Delta,\ldots\mid\theta,p_{\ell m})Y_{\ell m}(\hat{g})\sum\nolimits_{\ell m}K_{\ell m}K_\ell(b,\Delta,\ldots\mid\theta)p_{\ell m}Y_{\ell m}(\hat{g}).\tag{2}$$

The rotational invariants $K_\ell$ (b, Δ, . . . |θ) can be factorized into orthogonal functions that decouple tissue and protocol parameters using singular value decomposition (SVD):

$$K_\ell(b,\Delta,\ldots\mid\theta)\simeq\sum\nolimits_{n=1}^{N_\ell}u_n^{(\ell)}(b,\Delta,\ldots)s_n^{(\ell)}v_n^{(\ell)}(\theta).\tag{3}$$

Although not exact, this factorization can be done to any desired accuracy by, e.g., selecting an appropriate number of components $N_\ell$, way below practical signal-to-noise ratio (SNR) levels, as the singular values $s_n^{(\ell)}$ decrease fast with n for a given $\ell$. Thus, substituting Eq.(3) it into Eq.(2), we can now write the directional dMRI signal as:

$$S(b,\Delta,\hat{g}\mid\theta,p_{\ell m})=\sum\nolimits_{\ell m}s_n^{(\ell)}u_n^{(\ell)}(b,\Delta,\ldots)Y_{\ell m}(\hat{g})v_n^{(\ell)}(\theta)p_{\ell m}=\sum\nolimits_{\ell mn}\alpha_{\ell mn}\gamma_{\ell mn},\tag{4}$$

where $u_n^{(\ell)}$(b, Δ, . . . ) depends purely on the protocol (b, Δ, . . . represent acquisition parameters), and $v_n^{(\ell)}$ (θ) depends purely on the tissue. Protocol-dependent components are denoted $\alpha_{\ell mn}=s_n^{(\ell)}\,u_n^{(\ell)}$ (b, Δ, . . . ) $Y_{\ell m}$ (ĝ) and tissue-dependent components $\gamma_{\ell mn}=v_n^{(\ell)}(\theta)\,p_{\ell m}$. The kernel (microstructure) parameters θ=θ(x) and the ODF harmonics $p_{\ell m}=p_{\ell m}$(x) depend on the position (imaging voxel) x in the sample.

Practically, the decomposition of Equations (2)-(4) can work most efficiently if it is performed over a subset of voxels x of the same biophysical origin (for example, the same tissue type, such as, but not limited to, white matter; gray matter; stroma tissue in prostate; or fibrous tissue in kidneys), such that the kernel $\mathcal{K}$ within the subset of voxels has the same functional form (albeit parametrized by microstructure parameters θ=θ(x) that can still vary across the voxels). This functional form may be unknown—in fact, the present embodiments can offer a model-independent way to determine this form. Hence, it may be beneficial to pre-select a subset of voxels based on known tissue classification methods, and apply the exemplary methodology to the subset.

The assumption of the spherical convolution allows one to assign the "quantum numbers" $\ell$, m, n to the columns of the SVD matrix U in Equation (1), resulting in the multiplets of singular vectors (see FIG. 3*a*) with singular values $s_n^{(\ell)}$, ($2\ell$+1)-degenerate with respect to m, akin to atomic orbitals in the periodic table. (The term "quantum numbers" above is used here purely to draw an analogy with the periodic table or the spectrum of the Hydrogen atom.). For example, $\ell$ is the degree and m is the order of a spherical harmonic, and the index n=1,2, . . . numbers the singular value $s_n^{(\ell)}$ (sorted n decreasing order) for the multiplet of degree $\ell$. The $L_2$ norm over each multiplet (e.g., over the order m) facilitates the recovery of rotational invariants of the signal with no assumptions about the kernel's functional form:

$$S_\ell(b,\Delta\mid x,p_\ell)=\frac{1}{2\ell+1}\sum\nolimits_n\tilde{\alpha}_{\ell n}\tilde{\gamma}_{\ell n},\tag{5}$$

$$\alpha_{\ell n}=|\alpha_{\ell mn}|^{(m)}=\sqrt{\sum_m|\alpha_{\ell mn}|^2}=\sqrt{\frac{2\ell+1}{4\pi}}\left|u_n^{(\ell)}(b,\Delta)\right|,$$

$$\tilde{\alpha}_{\ell n}=\alpha_{\ell n}\times\mathrm{sign}\left(u_n^{(\ell)}(b,\Delta)\right).\tag{6}$$

$$\gamma_{\ell n}=|\gamma_{\ell mn}|^{(m)}=\sqrt{\sum_{m=-\ell\ldots\ell}|\gamma_{\ell mn}|^2}=\sqrt{4\pi(2\ell+1)}\,p_\ell\left|v_n^{(\ell)}(x)\right|,$$

$$\tilde{\gamma}_{\ell n}=\gamma_{\ell n}\times\mathrm{sign}\left(v_n^{(\ell)}(x)\right).\tag{7}$$

For example, the ODF rotational invariants $p_\ell=\sqrt{\sum_{m=-\ell\ldots\ell}|p_{\ell m}|^2}/\sqrt{4\pi(2\ell+1)}$ are defined with the conventional normalization factors such that $0\le p_\ell\le 1$. Solving Equation (5) enables the computation of the signal's rotational invariants $S_\ell$(b, Δ, $T_E$, . . . ) for $\ell$=0,2,4, . . . , even when just a single direction was acquired for each unique combination of experimental parameters, without any model assumptions on their functional form. This exemplary method of reconstructing signal's invariants is in contrast to the decomposition used in Reference 14, which requires shells, hence the exemplary system, method and computer-accessible medium, according to exemplary embodiments of the present disclosure, is more general and efficient. Assigning the "quantum numbers" $\ell$, m, n to the columns n of the SVD matrix U in Equation (1) can be done by relating it to the form of Equation (4) and using the orthogonality of spherical harmonics $Y_{\ell m}$ (ĝ). Columns of matrix U can be projected on the functions $Y_{\ell m}$ (ĝ) and multiplet of degree $\ell$ can be chosen as a set of columns (for example, $2\ell$+1 columns under the assumption of a perfect degeneracy within the multiplet), for which the norm of the projection coefficients is not small (for example, the norm is above a certain noise-dependent threshold, or, for example, choose $2\ell$+1 columns with the largest norm). These components can then be excluded from further consideration, for example, such that the subsequent $(n+1)^{st}$ multiplet of degree $\ell$ would have the largest norms out of remaining components, since the singular values $s_n^{(\ell)}$ decrease with n. This procedure can find every multiplet of degree $\ell$ and sort them in the order of their decreasing singular values $s_n^{(\ell)}$. This procedure can be repeated to find multiplets of every $\ell=0, 2, 4, \ldots$ down to the maximal $\ell$ limited by the angular resolution and the signal-to-noise ratio of the measurement.

According to exemplary embodiments of the present disclosure, due to degeneracy with respect to rotations within each multiplet, SVD may accidentally select a different basis $\tilde{Y}_{\ell m}(\hat{g})$, corresponding to an orthogonal rotation of spherical harmonics within a multiplet, relative to the laboratory frame. (Here, the laboratory frame can be, e.g., a frame of reference of an MRI scanner.) Thus, based on the projections of the multiplet components onto the standard basis $Y_{\ell m}(\hat{g})$, exemplary embodiments can apply a unitary transformation to rotate the components in the local basis $\tilde{Y}_{\ell m}(\hat{g})$ back to the standard basis $Y_{\ell m}(\hat{g})$ in the laboratory frame, where exemplary embodiments can analytically evaluate Equations (6) and (7). These equations also describe the procedure of assigning the signs to the m-independent rotational invariants $\alpha_{n\ell}$ and $\gamma_{n\ell}$. The fiber ODF components $p_{\ell m}$ can be then reconstructed from $\gamma_{\ell mn}=p_{\ell m} v_n^{(\ell)}(x)$ in the laboratory frame after the $\tilde{Y}_{\ell m}(\hat{g}) \rightarrow Y_{\ell m}(\hat{g})$ rotation.

According to an exemplary embodiment of the present disclosure, microstructure model's parameters (such as, but not limited to, compartment fractions, which can relate to intra/extra-cellular space volumes; compartment diffusivities; relaxation rates; exchange rates between compartments; characteristics of structural disorder such as axonal beading) can then be determined from the reconstructed signal's rotational invariants $S_\ell(b, \Delta, TE, \ldots)$, Equation (5), by assuming a particular biophysical model of the fiber kernel $\mathcal{K}$ for example as in Reference 1. Such parameter estimation can be done either using maximum likelihood estimation, or using machine learning-based methods, by mapping the invariants $S_\ell(b, \Delta, TE, \ldots)$ to model parameters using linear or nonlinear regression over a training set.

Exemplary Parameter Estimation from Non-Rotationally-Invariant Spatially-Varying Acquisitions Exemplary system, method and computer-accessible medium, according to exemplary embodiments of the present disclosure, can be applied to parameter estimation of a particular model of diffusion in tissue (exemplified by the particular functional form of the fascicle response kernel) in challenging scenarios, where the acquisition protocol is not constant throughout the field of view (FOV), e.g., when gradient nonlinearities are high (such as those in recently developed high-performance gradient systems, References 16,17). In such scenarios, the FOV may contain a spatially varying acquisition protocol where diffusion weightings are not grouped in shells, and the protocol varies noticeably from point to point. Here, it may be unfeasible to re-train a machine learning estimator for every single voxel (typically $\sim 10^5$-$10^6$ voxels in a normal brain). Thus, exemplary systems, methods and computer-accessible medium, according to exemplary embodiments of the present disclosure can provide a solution that enables the computation of tissue features that depend on the model that can be linearly estimated from any non-shelled protocol. Then, these can be mapped to the microstructure parameters of the model in question.

The estimation procedure according to various exemplary embodiments of the present disclosure can rely on the possibility to separate the contributions of the tissue and of the acquisition parameters via the SVD decomposition, such as Equation (3) above. For a given model, there is a specific functional form of the kernel $\mathcal{K}$ and, thereby, its rotational invariants $K_\ell(b, \Delta, \ldots | x)$ for any $\ell=0,2,4,\ldots$. According to exemplary embodiments, the kernel $\mathcal{K}$ and its rotational invariants can be used to generate a library of signals corresponding to a given biophysical tissue model, where the tissue parameters (θ) can be varied in physically plausible ranges, and the acquisition parameters (such as, but not limited to, b, Δ, echo time, etc. —henceforth labeled as b, Δ, . . . ) can vary in physically plausible ranges. Exemplary embodiments of the present disclosure can construct a large matrix for each rotational invariant $K_\ell(b, \Delta, \ldots | x)$ where each row contains the different combinations of kernel microstructure and each column a different combination of acquisition parameters.

Following Eq. (3), the systems, methods and computer-accessible medium according to various exemplary embodiments of the present disclosure can perform a singular value decomposition of such library and obtain $u_n^{(\ell)}(b, \Delta, \ldots)$ and $v_n^{(\ell)}(\theta)$. It can be useful that the protocol parameter combinations are sampled in such a way that admits convenient interpolation; for example, at the so-called Chebyshev nodes (e.g., the roots of Chebyshev polynomials), since in the procedures according to exemplary embodiments of the present disclosure this matrix will need to be interpolated to evaluate $u_n^{(\ell)}(b, \Delta, \ldots)$ at the protocol values (such as, but not limited to, e.g., b, Δ, . . . ) not contained in the training set (to mimic any possible protocol used in any voxel under consideration). Then, following Eq. (4), the factorization of the ODF can be employed in the spherical harmonics basis. Thus for any protocol's set of parameters b, Δ, . . . (at each voxel) the term $\alpha_{\ell mn}=s_n^{(\ell)} u_n^{(\ell)}(b, 0, \ldots) Y_{\ell m}(\hat{g})$ can be computed by exemplary embodiments of the present disclosure. Based on the known $\alpha_{\ell mn}$, (e.g., via linear fit, or using any other method), the corresponding tissue term in a given voxel x: $\gamma_{\ell mn}=p_{\ell m}(x) v_n^{(\ell)}(\theta(x))$ can be estimated. Further, according to exemplary embodiments of the present disclosure, it is possible to map $\gamma_{\ell mn}$ to the kernel parameters θ, and the fiber ODF parameters $p_{\ell m}$. This can be done with any data driven regression using the library created at the previous step, and making use of the fact that it is the same mapping for all voxels. This exemplary procedure therefore can be made computationally highly efficient, as it is protocol independent, and avoids costly training for each protocol/voxel separately.

Exemplary Rotational Invariants from Acquisitions with k-Space Undersampling

Exemplary system, method and computer-accessible medium, according to exemplary embodiments of the present disclosure can transform Equation (2) to link the functional form of the diffusion MRI signal from a single voxel to the Fourier transform S(b,ĝ|k) of a slice or a 3-dimensional organ measured using diffusion MRI:

$$S(b, \ldots, \hat{g} | k) = \int_\Omega dx\, S(b, \ldots, \hat{g} | x) e^{-ikx} \tag{8}$$

-continued $$= \int_{\Omega} dx e^{-ikx} \sum_{\ell m} K_\ell(b, \ldots \mid \theta(x)) p_{\ell m}(x) Y_{\ell m}(\hat{g})$$

where x and k denote the positions in the spatial and frequency domains. Here by, all other experimental parameters (diffusion time, echo time, inversion time, etc) are meant. In exemplary embodiments, microstructural parameters θ(x) of the kernel and ODF $p_{\ell m}$ (x) both depend on x in this formulation. Interchanging the order of integration and summation, and substituting for $K_\ell$ the SVD introduced in Equation (3) yields:

$$S(b, \ldots, \hat{g} \mid k) = \sum_{\ell mn} s_n^{(\ell)} Y_{\ell m}(\hat{g}) u_n^{(\ell)}(b, \ldots) \int_{\Omega} dx\, e^{-ikx} v_n^{(\ell)}(\theta(x)) p_{\ell m}(x) = \sum_{\ell mn} s_n^{(\ell)} \cdot u_n^{(\ell)}(b, \ldots) Y_{\ell m}(\hat{g}) \cdot V_{n\ell m}(k) \equiv \sum_{n'} S_{n'} U_{n'}(b, \ldots, \hat{g}) V_{n'}(k), \tag{9}$$

Equation (9) has the form of an SVD over all DWI and k-space points, where $$U_{n\ell m}(b, \ldots, \hat{g}) = u_n^{(\ell)}(b, \ldots) Y_{\ell m}(\hat{g}), \text{ and} \tag{10a}$$

$$V_{n\ell m}(k) = \int_{\Omega} dx\, e^{-ikx} v_n^{(\ell)}(\theta(x)) p_{\ell m}(x), \tag{10b}$$

such that $U_{n\ell m}$ depend only on measurement protocol, and $V_{n\ell m}$ only on the tissue parameters. As above, if exemplar embodiments manage to map the SVD index numbering the eigenstates n'→ $n\ell m$ to the "quantum numbers" n, $\ell$, m, embodiments can eventually identify kernel basis functions, $v_n^{(\ell)}$ (θ(x)), ODF $p_{\ell m}$ (x), and protocol basis functions, $u_n^{(\ell)}$ (b, . . . ). In α spatial dimensions, the tissue basis functions are $$\tilde{V}_{n\ell m}(x) = v_n^{(\ell)}(\theta(x)) p_{\ell m}(x) = \int_{\Omega} \frac{d^d k}{(2\pi)^d} e^{ikx} V_{n\ell m}(k). \tag{11}$$

According to exemplary embodiments of the present disclosure, undersampling each of the measurements S(b, Δ, . . . , ĝ|k), with particular set of b, Δ, ĝ, . . . in the k– space, Equation (8), can be either regular, such as in conventional parallel imaging, or using arbitrary k-space trajectories, such as radial or spiral, FIG. 6. It can be advantageous that such trajectories are complementary (not the same) for different protocol parameters (e.g., diffusion directions, b-values, etc), such that undersampling artifacts can become incoherent, and they all together help fill in the missing k-space points (e.g., information), such that together, there can be enough information to fill in the missing k-space points in the resulting right eigenstates $V_{n'}$ (k)→ $V_{n\ell m}$ (k), which can be subsequently Fourier transformed to obtain maps $V_{n\ell m}$ (x) as in Equation (11), and thereby obtain maps of rotational invariants and model parameters, as described with respect to exemplary embodiments of the present disclosure as described above, analogously to Equations (5)-(7), and the exemplary model parameter maps can be found voxelwise, as previously described (analogously to the fully-sampled case).

According to exemplary embodiments of the present disclosure, the overarching principle of filling in the missing k-space points in the signal S(b, Δ, . . . , ĝ|k) is that, after SVD, the signal can be effectively observed in the basis of different spherical harmonics, rather than distinct diffusion directions. These harmonics can act in analogy to distinct radiofrequency coils in the parallel imaging reconstruction, supplying complementary information for filling in the missing k-space information.

In general, to assign the "quantum numbers" n, $\ell$, m in the k-space, even in the case of undersampled measurements, according to exemplary embodiments of the present disclosure, it is possible to project the left eigenstates $U_{n'}$ (b, . . . , g) on the set of spherical harmonics $Y_{\ell m}$ (g) as described above. After the multiplets are identified, it is possible, according to the exemplary embodiments of the present disclosure, to focus on particular n and $\ell$, and, optionally, rotate the directional components into the laboratory frame as described herein.

Figure 7:
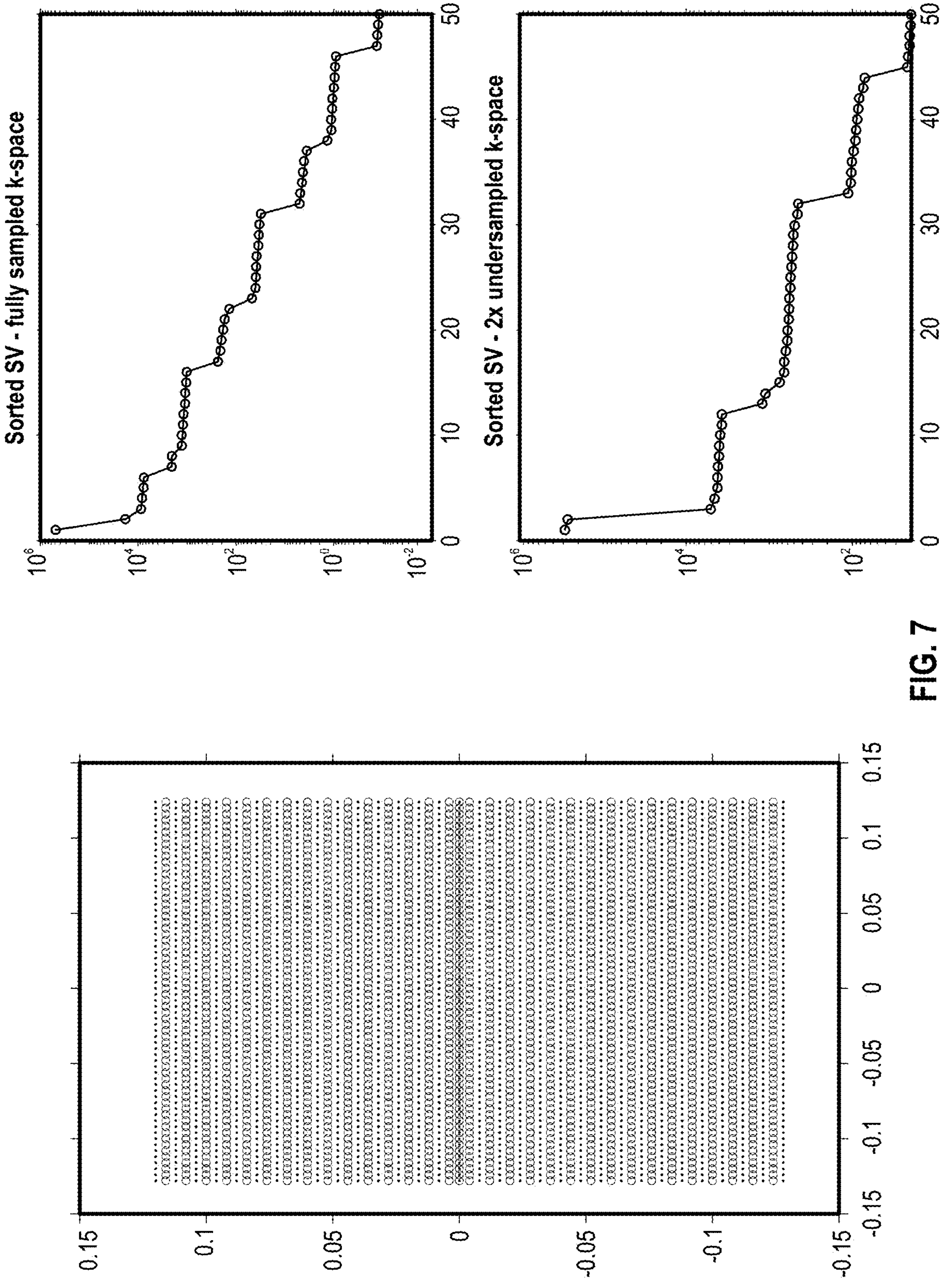
FIG. 7 is an exemplary illustration of the multiplet doubling in the case of regular R=2 undersampling according to exemplary embodiments of the present disclosure.

According to exemplary embodiments of systems, methods and computer-accessible medium of the present disclosure for the regular undersampling, as shown in FIG. 7, the SVD of the signal, Equation (8) with zeros in the place of missing k-space lines, can lead to the proportional increase in the multiplet size—such as doubling for R=2 undersampling (2 instead of 1 degenerate singular values or $\ell$ =0, 10 instead of 5 for $Y_{\ell m}$ =2, etc). This can mean that, for example, for the multiplet pairs of $\ell$ =0 states with R=2 undersampling, the corresponding right eigenstates $V_{n00}$ have nearly-complementary k-space information. Their relative phases can be fixed by ensuring their proportionality (or similarity) within the shared k-space lines, e.g., the line(s) passing through the center of the k-space. In exemplary embodiments of the present disclosure, once the phases match, the nearly-degenerate pairs of the right eigenstates $V_{n00}$ can be merged together, sampling the k-space fully.

A similar procedure can be applied, according to exemplary embodiments, to $\ell$ >0, by finding the pairs (for R=2) of the states corresponding to $Y_{\ell m}$ (g) with the same $\ell$ and m (possibly after rotating into the lab frame as described above). In exemplary embodiments, such combinations of states (pairs for R=2, and proportionally larger sets for R>2 undersampling) can be merged together to jointly fill the k-space, for each n, $\ell$ -multiplet. Those shared right eigenstates can then be shared among the corresponding degenerate (n, $\ell$, m) states within a given multiplet. In this way, according to exemplary embodiments of the present disclosure, the missing k-space information is restored for each state n' →n, $\ell$, m.

According to exemplary embodiments of systems, methods and computer-accessible medium of the present disclosure, for irregular undersampling, such as spiral trajectories one way to reconstruct the images is to perform non-uniform Fourier transform (NUFFT), including the regridding, for every undersampled trajectory (e.g., a spiral). The imaging artifacts can act like quasi-incoherent "noise", and given their independence from each other in each voxel, the maps of invariants and parameters can be reconstructed by exemplary embodiments of the present disclosure, as in Equations (1)-(7) above, in real space x. According to various exemplary embodiments of the present disclosure, it is possible to perform SVD already in the k-space after the regridding.

Approximate multiplets can appear. These multiplets can be assigned the numbers n, $\ell$, m as described above.

The shared information among the nearly-degenerate right eigenvectors $V_{n\ell m}$ (k), where each can appear undersampled, can be used by the systems, methods and computer-accessible medium according to various exemplary embodiments of the present disclosure to restore $V_{n\ell m}$ (k) (by merging the states corresponding to the same n, $\ell$, m in the k-space, for example), and then by sharing them. For example, for $\ell$=0, it is known that there should not be any dependence on the gradient direction g, hence states $V_{n00}$(k) should be just combined in the k-space with direction-independent weights. For $\ell$>0, the knowledge of $u_n^{(\ell)}$ (b, . . . ) $Y_{\ell m}$ (ĝ) can facilitate the systems, methods and computer-accessible medium according to various exemplary embodiments of the present disclosure to factor out the protocol dependence and combine the $V_{n\ell m}$ (k) parts of the eigenstates (effectively, this enables the knowledge of the weights with which $V_n V_{n\ell m\ m}$(k) are combined). After the combination, the oversampled net $V_n V_{n\ell m\ m}$(k) can be, for example, regridded and Fourier transformed to the x-space (NUFFT) in a standard way, Equation (11), after which rotational invariants and model parameters follow as in the previous case when exemplary embodiments started from the real space.

According to exemplary embodiments of the present disclosure, the above exemplary procedures of filling in the missing k-space information, either for regular or irregular undersampling, can be further iteratively repeated, to improve accuracy and precision. The benefit of using iterations may follow from the fact the SVD of the signal matrix of Equation (9) is performed with zeroes in all undersampled k-space points. These zeroes can result in certain errors in the singular values and left- and right-singular vectors U and V in procedures described herein. After either of such exemplary procedures is completed, the multiplets $s_n^{(\ell)} u_n^{(\ell)}$ (b, . . . ) $Y_{\ell m}$ (ĝ) $V_n V_{n\ell m\ m}$(k) with combined (merged) $V_n V_{n\ell m\ m}$(k) can result in the prediction for the un-measured k-space points for each measurement. In exemplary embodiments, combining those predictions with the original measurements, instead of placing zeroes for the un-measured k-space points, can improve the next iteration; the further iteration can further improve the un-measured S(b, Δ, . . . , ĝ|k) and so on, until convergence given SNR-related precision, for example.

The systems, methods and computer-accessible medium according to various exemplary embodiments of the present disclosure can be used to further learn the linear kernel in the joint (q,k)-space, for restoring the missing k-space points in the signal S(b, Δ, . . . , ĝ|k), based on the subset of the signal measured fully, and/or based on the above k-space filling procedures. The kernel can be further learned after the SVD, where it can split into distinct kernels for each $\ell$ and n multiplet separately. Exemplary embodiments of the present disclosure can use multiplets with smaller n (and thereby higher SNR) to learn such kernel(s) and apply those to multiplets with larger n, where such kernels can be different for different $\ell$. Overall, the spherical convolution functional form, Equation (1), can be convenient, as it can provide a necessary functional constraint on the signal to ensure filling in the missing k-space information, yet does not constrain the functional form of the kernel $\mathcal{K}$, and thereby can apply to a broad variety of physical situations, such as multi-compartment models, models with exchange, structural disorder (non-Gaussian diffusion) in the compartments of the kernel, etc. Furthermore, noise, or lack of axial symmetry of the kernel $\mathcal{K}$, according to exemplary embodiments of the present disclosure, can lead to lifting of the degeneracy within at least one of the multiplets. The above exemplary procedures of exemplary embodiments of the present disclosure may still be applied, by identifying the corresponding states that are similar to subset of $Y_{\ell m}$ (or their rotated analogs). Identifying combinations of such states with complementary k-space information can be used by the systems, methods and computer-accessible medium according to various exemplary embodiments of the present disclosure to jointly restore the missing k-space information in at least one of those states.

FIG. 1 shows a flow diagram of exemplary steps/procedures to determine exemplary rotational invariants from non-shelled acquisitions. In step 105, dMRI can be acquired with directions covering a sphere instead of a shell. At step 110, tissue can be segmented by type, and at step 115, the systems, methods and computer-accessible medium according to various exemplary embodiments of the present disclosure can perform SVD on a subset of voxels within a tissue type as segmented at 110. Next, singular vectors can be grouped into multiplets based on symmetries at step 120. In some exemplary embodiments of the present disclosure, the vectors can be rotated within each multiplet to the standard spherical harmonics basis. At step 125, the systems, methods and computer-accessible medium according to various exemplary embodiments of the present disclosure can compute m-independent $\alpha_{\ell n}$ and $\gamma_{\ell n}$, and their signs. Further, at step 130, the systems, methods and computer-accessible medium according to various exemplary embodiments of the present disclosure can compute rotational invariants where tissue parameters or their maps θ(x) and $p_{\ell m}$(x) can be determined based on standard parameter estimations methods.

FIG. 2 illustrates a flow diagram of exemplary steps/procedures to perform an exemplary parameter estimation from non-rotationally-invariant spatially-varying acquisitions. For example, at step 205, the systems, methods and computer-accessible medium according to various exemplary embodiments of the present disclosure can be used to acquire data where FOV has spatially varying dMRI protocol. Then, at step 210, the systems, methods and computer-accessible medium according to various exemplary embodiments of the present disclosure can generate a library for a given model (e.g. at Chebyshev points for the protocol parameters) and perform its SVD. At step 215, the systems, methods and computer-accessible medium according to various exemplary embodiments of the present disclosure can compute protocol-specific $\alpha_{\ell mn}$ by interpolating the library for the protocol of each voxel. Next, at step 220, the systems, methods and computer-accessible medium according to various exemplary embodiments of the present disclosure can estimate tissue-specific $\gamma_{\ell mn}$ for each voxel given $\alpha_{\ell mn}$ and the signal. Further, at step 225, the systems, methods and computer-accessible medium according to various exemplary embodiments of the present disclosure can estimate tissue parameter (kernel and ODF) from $\gamma_{\ell mn}$ (e.g., via regression trained to map $\gamma_{\ell mn}$ to kernel and ODF parameters).

Figure 3A:
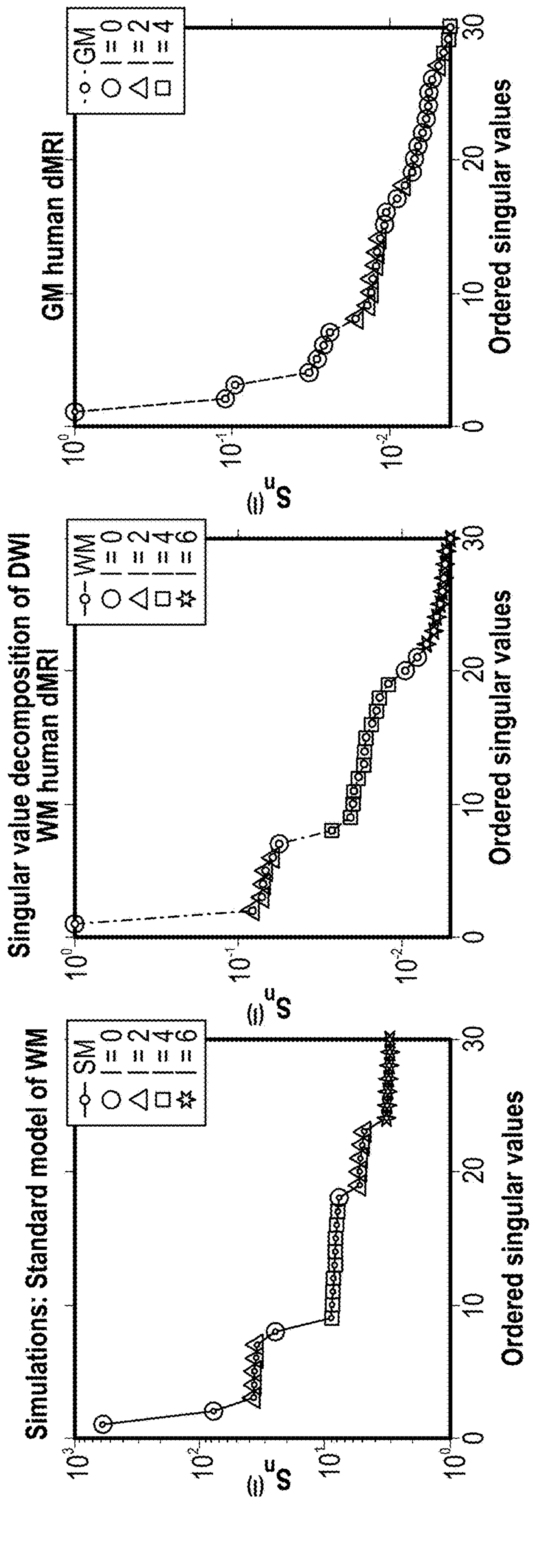
FIG. 3*a* is set of exemplary graphs showing exemplary singular values of a large set of dMRI from simulations and brain data according to an exemplary embodiment of the present disclosure.
Figure 3B:
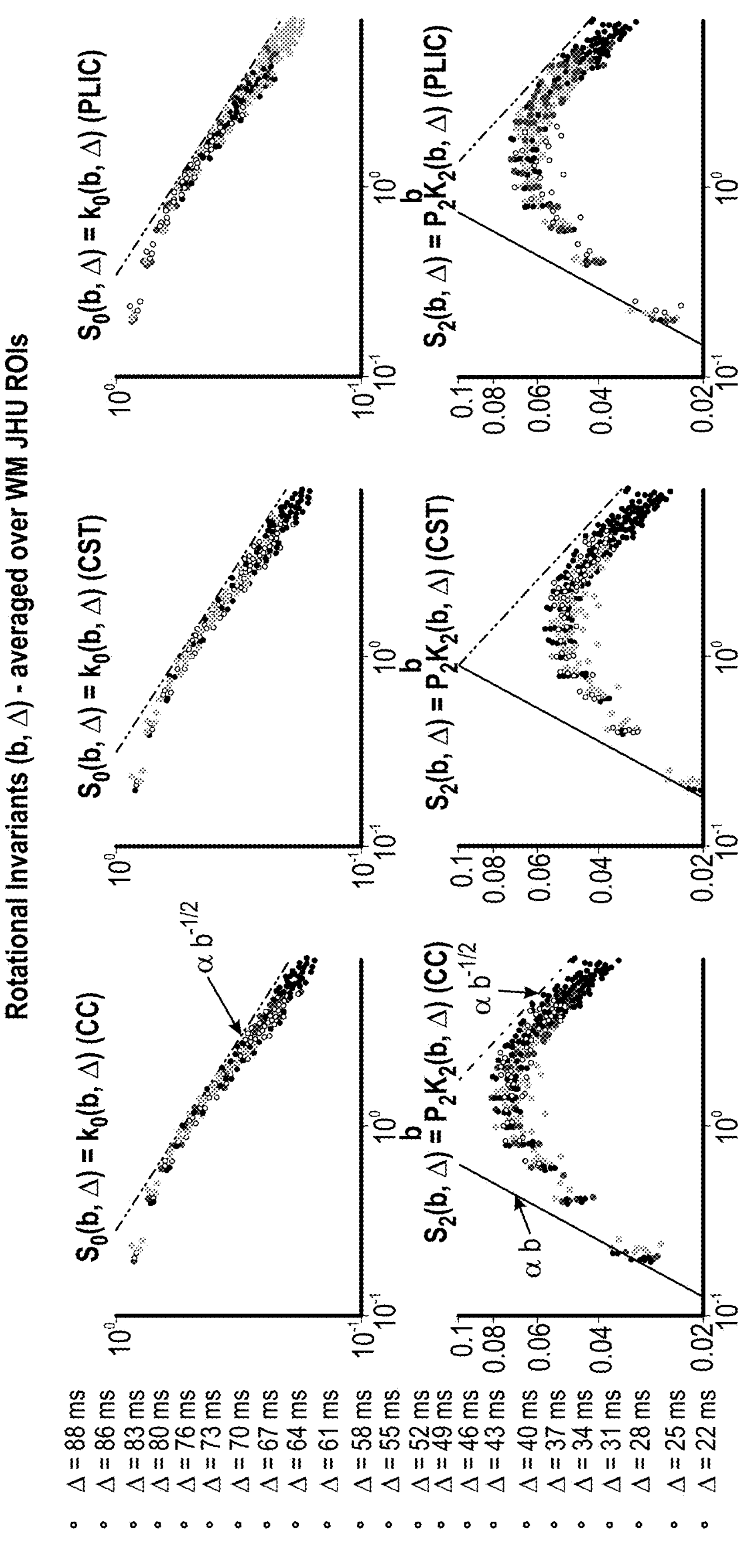
FIG. 3*b* is set of exemplary graphs showing exemplary rotational invariants reconstructed for each measured combination of b-value and diffusion time Δaccording to an exemplary embodiment of the present disclosure.
Figure 3C:
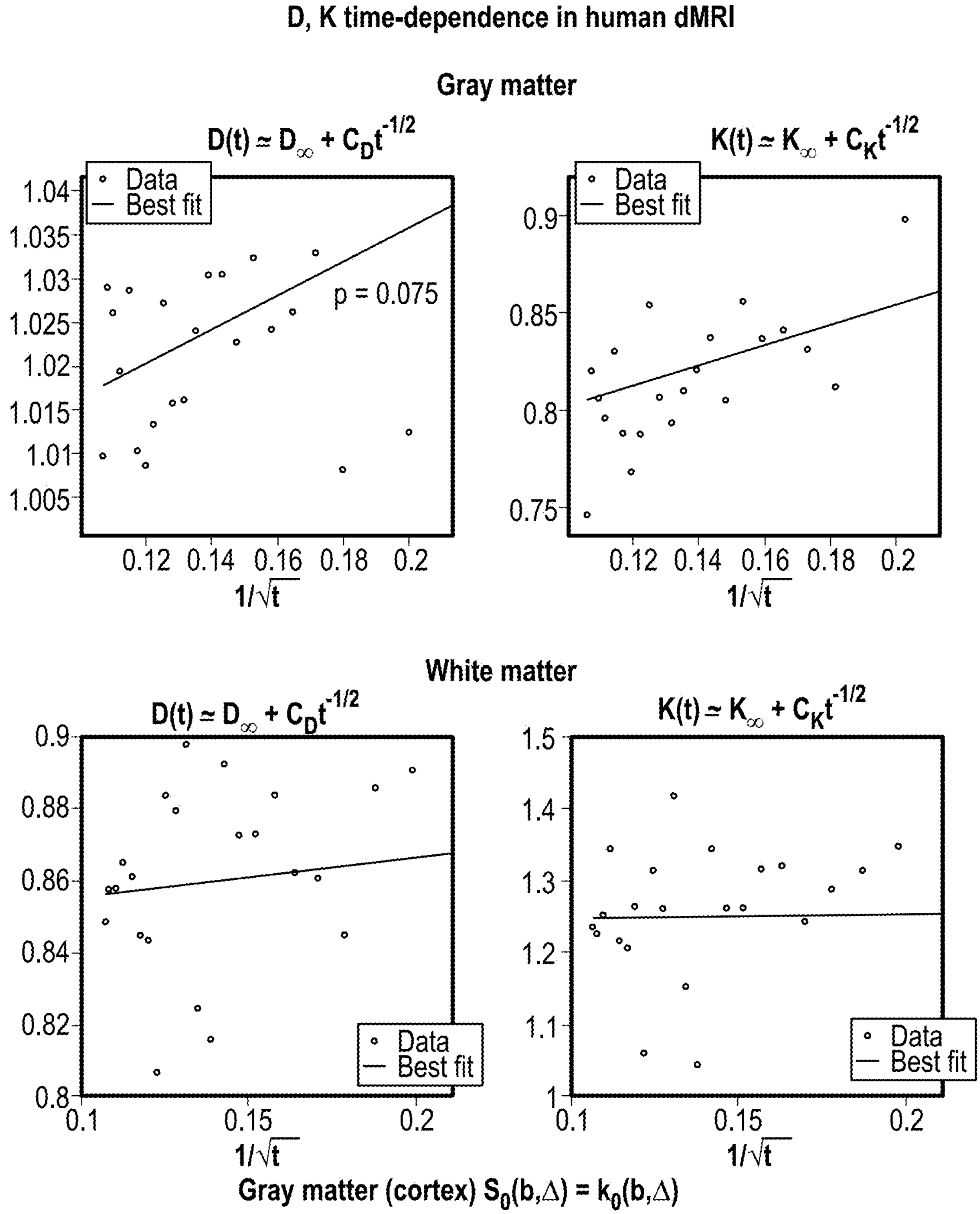
FIG. 3*c* is set of exemplary graphs showing exemplary diffusion and kurtosis time dependence for white and gray matter according to an exemplary embodiment of the present disclosure.
Figure 3D:
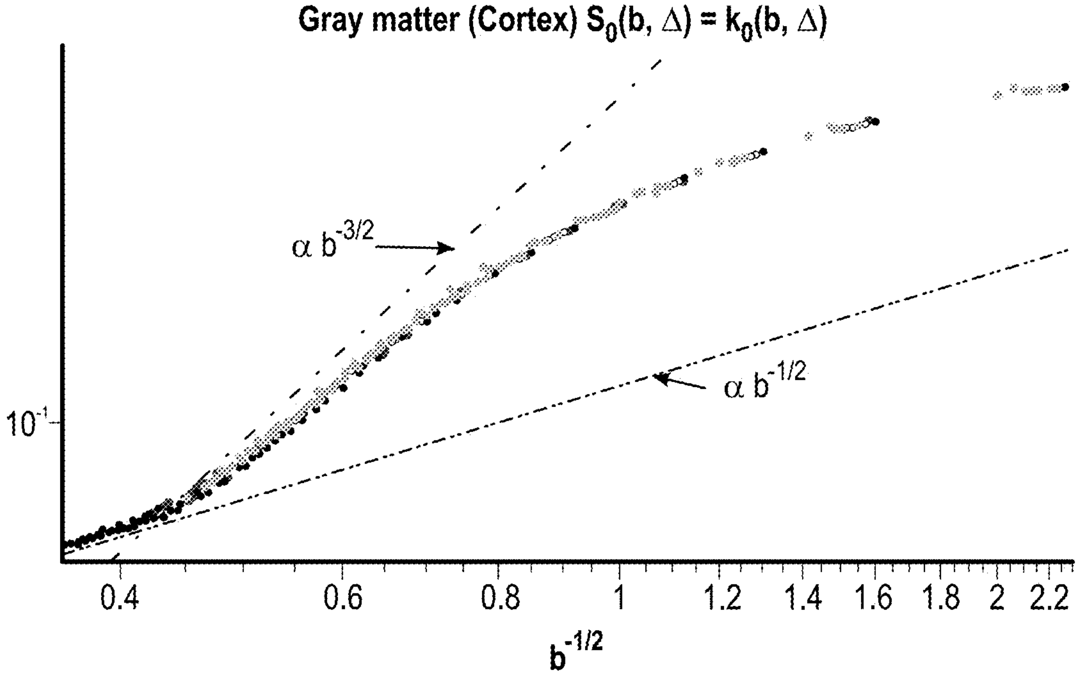
FIG. 3*d* is an exemplary graph for an exemplary rotational invariant $S_0(b, \Delta)$ averaged over the gray matter cortex, assembled from the eigenvectors and eigenvalues of the dMRI matrix according to exemplary embodiments of the present disclosure.

FIG. 3*a* shows a set of exemplary graphs showing exemplary singular values of a large set of dMRI from simulations and brain data. For example, the systems, methods and computer-accessible medium according to various exemplary embodiments of the present disclosure, degenerated singular values of each degree l of the fiber ODF can be observed exactly on simulated data, and with some noise in the noisy MRI data from a live human brain. Simulations show these are robust to the assignment of b-value, diffusion time, and directions, as long as all directions are sufficiently uniformly distributed on the sphere. FIG. 3*b* illustrates a set of exemplary graphs showing exemplary rotational invariants reconstructed for each measured combination of b-value and diffusion time Δ. In such exemplary graphs of FIG. 3*b*, e.g., only a single direction was sampled for each pair of b and Δ. FIG. 3*c* shows a set of exemplary graphs providing an exemplary diffusion and kurtosis time dependence for white and gray matter, according to exemplary embodiments of the present disclosure. Such exemplary graphs can correspond to previously determined ones in Reference 15, where a shelled acquisition was employed. FIG. 3*d* shows an exemplary graph for an exemplary rotational invariant $S_0(b, \Delta)$ according to exemplary embodiments of the present disclosure, averaged over the gray matter cortex, assembled from the eigenvectors and eigenvalues of the dMRI matrix.

Figure 4:
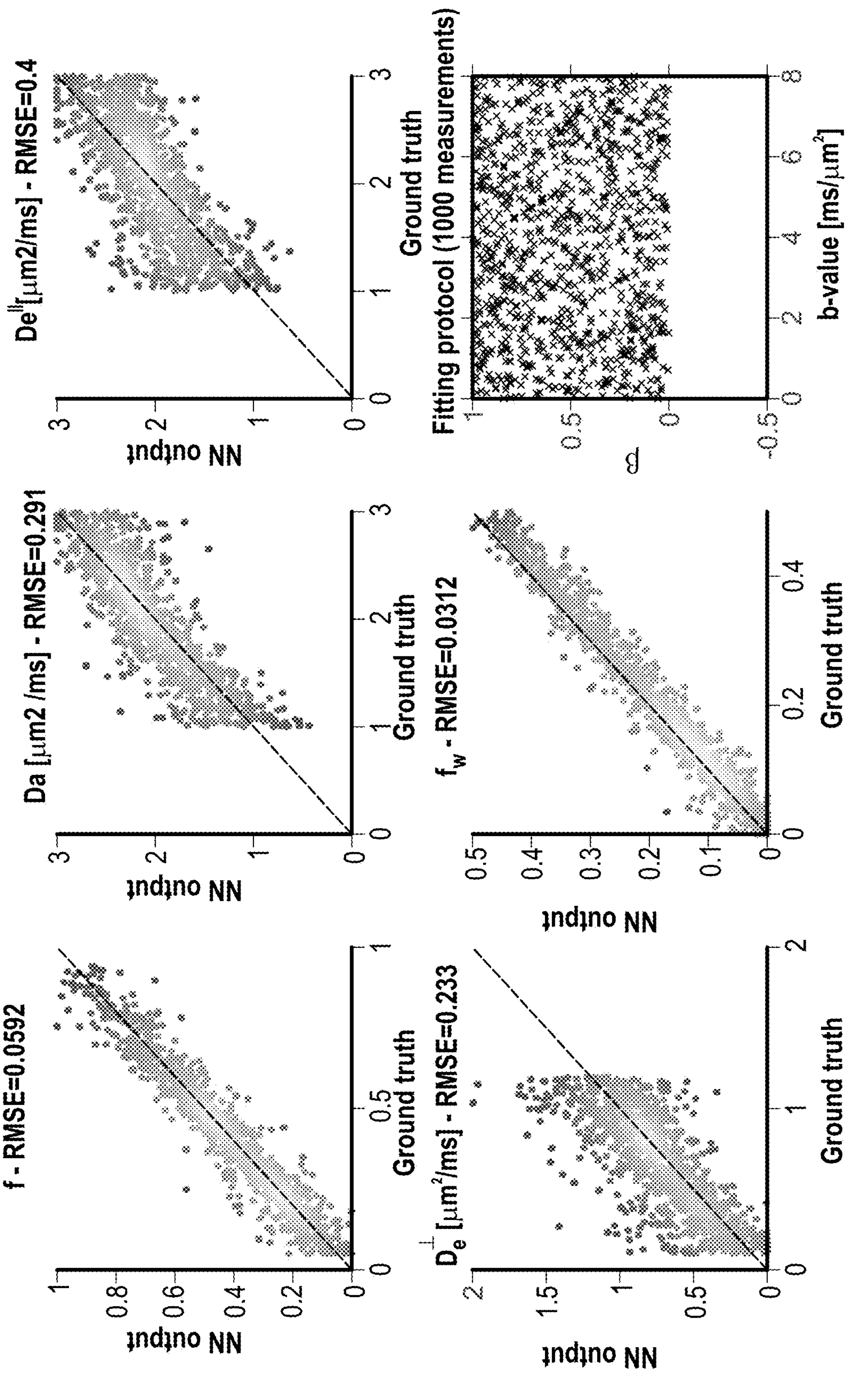
FIG. 4 is set of exemplary graphs of an exemplary noise propagation experiment according to exemplary embodiments of the present disclosure.

FIG. 4 illustrates exemplary noise propagation experiment according to exemplary embodiments of the present disclosure. FIG. 4 shows the ability of the exemplary embodiments to recover Standard Model parameters f, $D_\alpha$, $D_e^{\|}$, $D_e^{\perp}$, $f_w$ (defined in Reference 1) from the rotational invariants constructed from non-shelled spatially-varying acquisitions. This was done using a fully connected neural network, trained for multiple b-values and B-tensor shapes parametrized by β.

FIG. 4 shows a set of graphs illustrating the feasibility of an exemplary embodiment of the present disclosure with a simulation example. As shown in FIG. 4, synthetic dMRI signals can be generated following the Standard Model of diffusion in white matter, as described in Reference 1. Signals have a signal-to-noise ratio (SNR) of 200 and were acquired for varying b and B—tensor shape β combinations, each with a unique gradient direction on a sphere.

Figure 5:
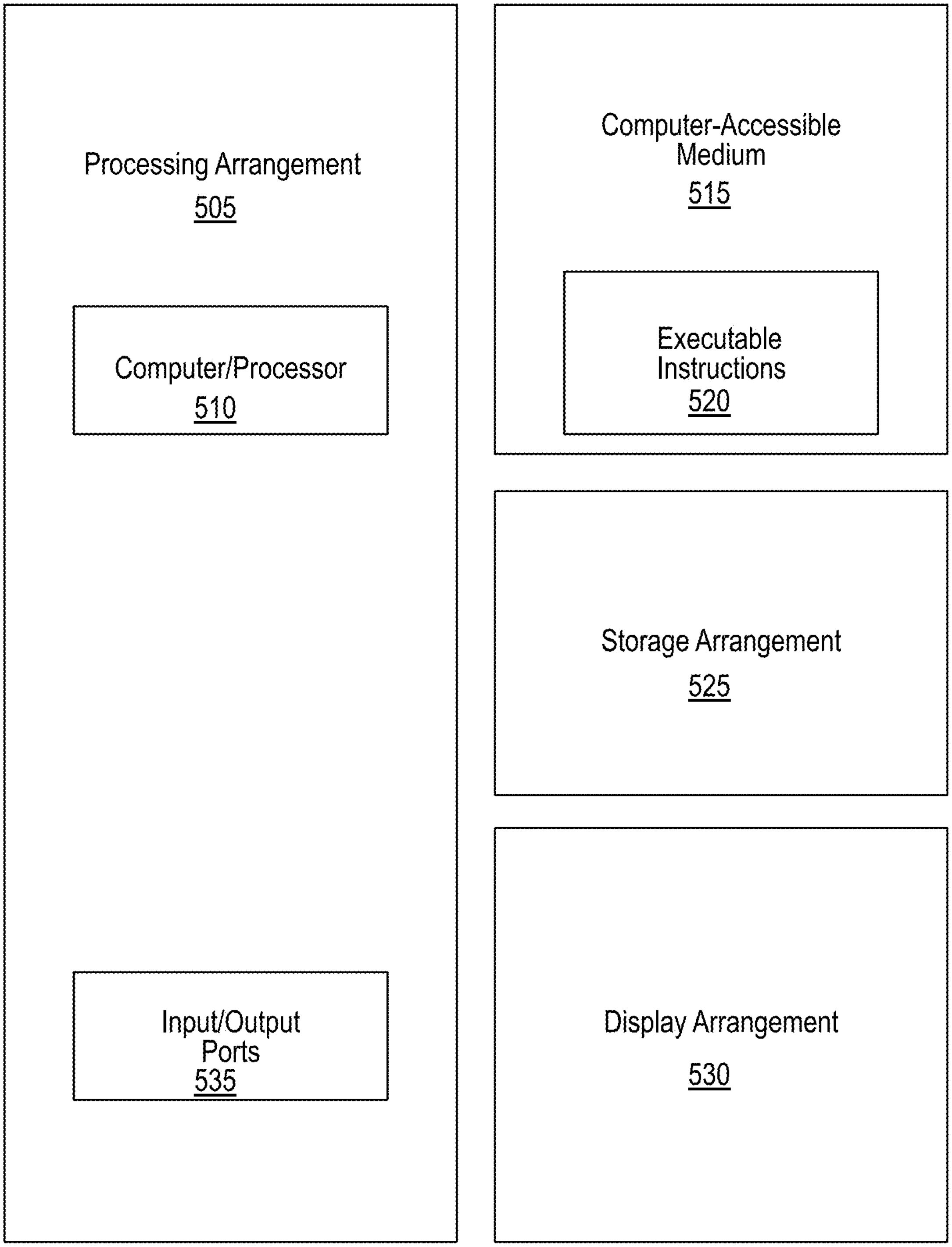
FIG. 5 is a block diagram of an exemplary embodiment of a system according to the present disclosure.

FIG. 5 shows a block diagram of an exemplary embodiment of a system according to the present disclosure. For example, exemplary procedures in accordance with the present disclosure described herein can be performed by a processing arrangement and/or a computing arrangement (e.g., computer hardware arrangement) 505. Such processing/computing arrangement 505 can be, for example entirely or a part of, or include, but not limited to, a computer/processor 510 that can include, for example one or more microprocessors, and use instructions stored on a computer-accessible medium (e.g., RAM, ROM, hard drive, or other storage device).

As shown in FIG. 5, for example a computer-accessible medium 515 (e.g., as described herein above, a storage device such as a hard disk, floppy disk, memory stick, CD-ROM, RAM, ROM, etc., or a collection thereof) can be provided (e.g., in communication with the processing arrangement 505). The computer-accessible medium 515 can contain executable instructions 520 thereon. In addition or alternatively, a storage arrangement 525 can be provided separately from the computer-accessible medium 515, which can provide the instructions to the processing arrangement 505 so as to configure the processing arrangement to execute certain exemplary procedures, processes, and methods, as described herein above, for example.

Further, the exemplary processing arrangement 505 can be provided with or include an input/output ports 535, which can include, for example a wired network, a wireless network, the internet, an intranet, a data collection probe, a sensor, etc. As shown in FIG. 5, the exemplary processing arrangement 505 can be in communication with an exemplary display arrangement 530, which, according to certain exemplary embodiments of the present disclosure, can be a touch-screen configured for inputting information to the processing arrangement in addition to outputting information from the processing arrangement, for example. Further, the exemplary display arrangement 530 and/or a storage arrangement 525 can be used to display and/or store data in a user-accessible format and/or user-readable format.

Figures 6A, 6B, 6C:
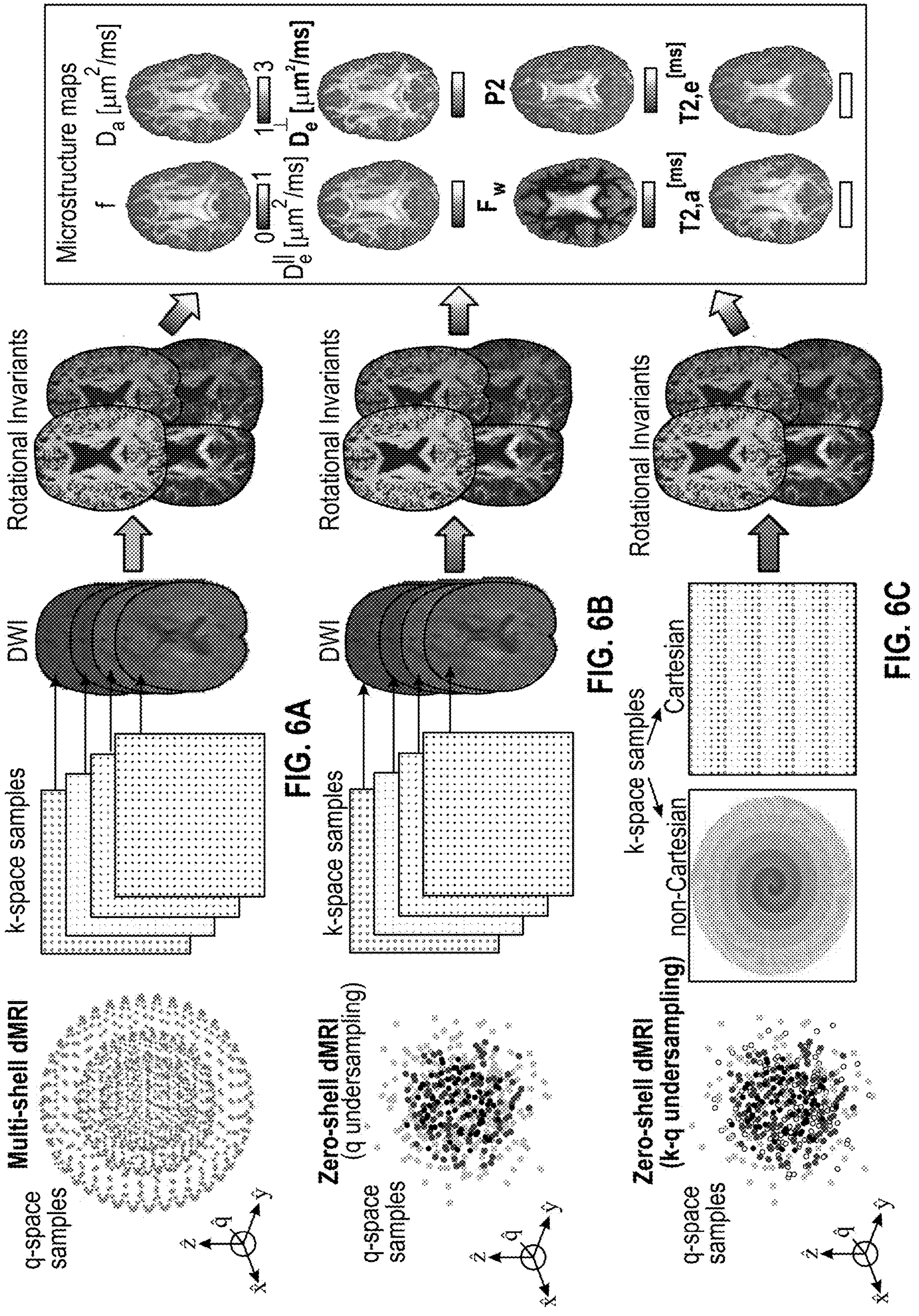
FIG. 6*a* is a set of illustration of exemplary procedures of standard multi-shell diffusion MRI according to exemplary embodiments of the present disclosure.
FIG. 6*b* is a set of illustration of exemplary procedures of zero-shell dMRI procedure for the fully-sampled k-space according to exemplary embodiments of the present disclosure.
FIG. 6*c* is a set of illustration of exemplary procedures of zero-shell dMRI procedure for undersampled k-space measurements, which may include regular or irregular (such as spiral) undersampling according to exemplary embodiments of the present disclosure.

FIGS. 6*a*-6*c* shows a set of illustrations of the exemplary procedures of standard multi-shell diffusion MRI (e.g., FIG. 6*a*), zero-shell dMRI procedure for the fully-sampled k-space, Equations (1)-(7) (e.g., FIG. 6*b*), and zero-shell dMRI procedure for undersampled k-space measurements, which may include regular or irregular (such as spiral) undersampling (e.g., FIG. 6*c*). FIG. 7 shows a set of illustrations for the multiplet doubling in the case of regular R=2 undersampling.

According to exemplary embodiments of the present disclosure, numerous specific details have been set forth. It is to be understood, however, that implementations of the disclosed technology can be practiced without these specific details. In other instances, well-known methods, structures and techniques have not been shown in detail in order not to obscure an understanding of this description. References to "some examples," "other examples," "one example," "an example," "various examples," "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrases "in one example," "in one exemplary embodiment," or "in one implementation" does not necessarily refer to the same example, exemplary embodiment, or implementation, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification and drawings, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

Throughout the disclosure, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

EXEMPLARY REFERENCES

The following reference is hereby incorporated by references, in their entireties:

[1]D. S. Novikov, et al., NMR Biomed., e3998, 2019.
[2]C. D. Kroenke, et al., Magn. Reson. Med., 52, 5, 1052-1059, 2004.
[3]Y. Assaf, et al., Magn. Reson. Med., 52, 965-978, 2004.
[4]S. N. Jespersen, et al., Neurolmage, 34, 1473-1486, 2007.
[5]E. Fieremans, et al., Proc ISMRM, 2012.
[6]H. Zhang, et al., Neurolmage, 61, 1000-1016, 2012.
[7]J. H. Jensen, et al., NeuroImage, 124, 824-833, 2016.
[8]M. Reisert, et al., NeuroImage, 147, 964-975, 2017.
[9]S. Jespersen, et al., NMR Biomed, 26, 1647-1662, 2013.
[10]E. Kaden, et al., NeuroImage, 139, 346-359, 2016.
[11]D. S. Novikov, et al., NeuroImage, 174, 518-538, 2018.
[12]I. Jelescu, et al., NeuroImage, 256, 119277, 2022.
[13]J. Olesen, et al., NeuroImage, 251, 118976, 2022.
[14]D. Christiaens, et al., IEEE TMI 38, 3, 2019.
[15]H-H. Lee, et al. NeuroImage, 222, 117054, 2022.
[16]T. K. F. Foo, et al. Magn. Reson. Med., 83(6), 2356-2369, 2019.
[17]S. Y. Huang, et al. NeuroImage, 243, 118530, 2021.

What is claimed is:

1. A non-transitory computer-accessible medium having stored thereon computer-executable instructions for determining a plurality of tissue parameters of at least one tissue, wherein, when a computer arrangement executes the instructions, the computer arrangement is configured to perform procedures comprising:
receiving information related to at least one diffusion magnetic resonance (dMR) image of the at least one tissue, wherein the dMR image is based on a plurality of scan parameters;
selecting a subset of imaging voxels that contains at least one voxel in at least one image;
generating protocol-specific and tissue-specific components of a signal in the selected subset of imaging voxels, wherein, when at least one scan parameter is modified, diffusion directions are undersampled; and
generating the at least one rotational invariant of the signal based on the at least one tissue-specific component of the signal in the at least one voxel of the selected subset of imaging voxels.

2. A method for determining a plurality of tissue parameters of at least one tissue, comprising:
receiving information related to at least one diffusion magnetic resonance (dMR) image of the at least one tissue, wherein the dMR image is based on a plurality of scan parameters;
selecting a subset of imaging voxels that contains at least one voxel in at least one image;
generating protocol-specific and tissue-specific components of a signal in the selected subset of imaging voxels, wherein, when at least one scan parameter is modified, diffusion directions are undersampled; and
generating the at least one rotational invariant of the signal based on the at least one tissue-specific component of the signal in the at least one voxel of the selected subset of imaging voxels.

3. A system for determining a plurality of tissue parameters of at least one tissue, comprising:
a computer hardware arrangement configured to:
receive information related to at least one diffusion magnetic resonance (dMR) image of the at least one tissue, wherein the dMR image is based on a plurality of scan parameters;
select a subset of imaging voxels that contains at least one voxel in at least one image;
generate protocol-specific and tissue-specific components of a signal in the selected subset of imaging voxels, wherein, when at least one scan parameter is modified, diffusion directions are undersampled; and
generate the at least one rotational invariant of the signal based on the at least one tissue-specific component of the signal in the at least one voxel of the selected subset of imaging voxels.

4. A non-transitory computer-accessible medium having stored thereon computer-executable instructions for determining a plurality of tissue parameters of at least one tissue, wherein, when a computer arrangement executes the instructions, the computer arrangement is configured to perform procedures comprising:
receiving information related to at least one diffusion magnetic resonance (dMR) image of the at least one tissue;
selecting a subset of imaging voxels that contains at least one voxel in at least one image;
generating protocol-specific and tissue-specific components of a signal in the selected subset of imaging voxels; and
generating the at least one rotational invariant of the signal based on the at least one tissue-specific component of the signal in the at least one voxel of the selected subset of imaging voxels, wherein the at least one rotational invariant of the tissue is generated based on the at least one component by estimating the $L_2$ norm across the index m for given $\ell$ and n, and assigning signs to such norms.

5. A non-transitory computer-accessible medium having stored thereon computer-executable instructions for determining a plurality of tissue parameters of at least one tissue, wherein, when a computer arrangement executes the instructions, the computer arrangement is configured to perform procedures comprising:

receiving information related to at least one diffusion magnetic resonance (dMR) image of the at least one tissue;

selecting a subset of imaging voxels that contains at least one voxel in at least one image;

generating protocol-specific and tissue-specific components of a signal in the selected subset of imaging voxels, wherein a fiber orientation distribution is generated based on at least one of the components is grouped into multiplets according to symmetries; and generating the at least one rotational invariant of the signal based on the at least one tissue-specific component of the signal in the at least one voxel of the selected subset of imaging voxels.

6. The computer-accessible medium of claim 1, wherein the received information is obtained by varying at least a dMR scan parameter.

7. The computer-accessible medium of claim 1, wherein the at least one dMR scan parameter is at least one of a diffusion direction, diffusion weighting, diffusion tensor, diffusion gradient wave form, diffusion tensor direction, diffusion time, echo time, or inversion time.

8. The computer-accessible medium of claim 1, wherein the subset of imaging voxels contains voxels for a particular tissue type.

9. The computer-accessible medium of claim 1, wherein the particular tissue type includes at least one of a white matter, a gray matter, a muscle tissue, a prostate tissue or a kidney tissue.

10. The computer-accessible medium of claim 1, wherein the generating protocol-specific and tissue-specific components of the signal is performed via singular value decomposition.

11. The computer-accessible medium of claim 1, wherein at least one of the components is grouped into multiplets according to symmetries.

12. The computer-accessible medium of claim 1, wherein the at least one rotational invariant of the tissue is generated based on the at least one component by estimating the $L_2$ norm across the index m for given $\ell$ and n, and assigning signs to such norms.

13. The computer-accessible medium of claim 1, wherein tissue parameters are estimated from rotational invariants based on the particular model of fiber response kernel.

14. The computer-accessible medium of claim 10, wherein the singular value decomposition is truncated at particular number of components, ensuring sufficient precision as determined by the signal-to-noise ratio.

15. The computer-accessible medium of claim 11, wherein:

the components are assigned at least one of the indices $\ell$, m, n based on symmetry considerations, wherein index $\ell$ corresponds to the degree and m is the order of a spherical harmonic;

components with the same index $\ell$ and different m form a multiplet of degree $\ell$ when their singular values are similar or approximately degenerate; and index n is assigned to a multiplet of degree $\ell$ based on its singular value, with the singular values for multiplets sorted in the decreasing order.

16. The computer-accessible medium of claim 11, wherein fiber orientation distribution is generated based on the estimated tissue components grouped into multiplets.

* * * * *